United States Patent
Stutterheim et al.

(10) Patent No.: US 11,621,361 B2
(45) Date of Patent: Apr. 4, 2023

(54) ARRANGEMENTS OF FLEXIBLE PHOTOVOLTAIC MODULES

(71) Applicant: FLISOM AG, Niederhasli (CH)

(72) Inventors: Stephan Stutterheim, Wallisellen (CH); Andreas Bogli, Vogelsang (CH); Ivan Sinicco, Altendorf (CH)

(73) Assignee: FLISOM AG, Niederhasli (CH)

( * ) Notice: Subject to any disclaimer, the term of this patent is extended or adjusted under 35 U.S.C. 154(b) by 677 days.

(21) Appl. No.: 16/071,145

(22) PCT Filed: Jan. 23, 2017

(86) PCT No.: PCT/IB2017/000030
§ 371 (c)(1),
(2) Date: Jul. 19, 2018

(87) PCT Pub. No.: WO2017/130050
PCT Pub. Date: Aug. 3, 2017

(65) Prior Publication Data
US 2021/0193854 A1 Jun. 24, 2021

Related U.S. Application Data

(60) Provisional application No. 62/288,260, filed on Jan. 28, 2016.

(51) Int. Cl.
*H02S 20/22* (2014.01)
*H01L 31/049* (2014.01)
(Continued)

(52) U.S. Cl.
CPC ...... *H01L 31/049* (2014.12); *H01L 31/03926* (2013.01); *H01L 31/046* (2014.12); *H05K 1/038* (2013.01); *H02S 20/22* (2014.12)

(58) Field of Classification Search
CPC ..... H01L 31/049; H01L 31/046; H02S 20/22; H02K 1/038
See application file for complete search history.

(56) References Cited

U.S. PATENT DOCUMENTS

| 8,674,211 B1 | 3/2014 | Palmer et al. |
| 8,683,755 B1 * | 4/2014 | Spence ................ B64G 1/222 52/173.3 |

(Continued)

FOREIGN PATENT DOCUMENTS

| DE | 20 2004 007 254 U1 | 11/2004 |
| DE | 10 2009 022641 A1 | 11/2010 |

(Continued)

OTHER PUBLICATIONS

English Machine Translation of DE 10 2009 022641 (Year: 2010).*

(Continued)

*Primary Examiner* — Bethany L Martin
*Assistant Examiner* — Kourtney R S Carlson
(74) *Attorney, Agent, or Firm* — Patterson & Sheridan, LLP

(57) ABSTRACT

A photovoltaic apparatus is provided including a first photovoltaic module and a second photovoltaic module. Each photovoltaic module includes a front sheet having an outer portion and an inner portion. The outer portion is disposed around a core to form a keder. Each photovoltaic module further includes a back sheet and a photovoltaic device disposed between the front sheet and the back sheet. Each photovoltaic device includes an array of photovoltaic cells.

13 Claims, 5 Drawing Sheets

(51) Int. Cl.
    *H01L 31/046*     (2014.01)
    *H01L 31/0392*     (2006.01)
    *H05K 1/03*     (2006.01)

(56) References Cited

U.S. PATENT DOCUMENTS

| | | | | |
|---|---|---|---|---|
| 9,563,632 | B2* | 2/2017 | Taylor | G06F 16/17 |
| 2003/0000569 | A1* | 1/2003 | Zwanenburg | B64G 1/222 |
| | | | | 136/251 |
| 2006/0225781 | A1 | 10/2006 | Locher | |
| 2006/0283495 | A1* | 12/2006 | Gibson | H01L 31/046 |
| | | | | 136/246 |
| 2013/0263393 | A1* | 10/2013 | Mazumder | A47L 13/40 |
| | | | | 427/535 |
| 2015/0027516 | A1* | 1/2015 | Rummens | B32B 27/32 |
| | | | | 136/251 |
| 2015/0311365 | A1* | 10/2015 | Frolov | H01L 31/042 |
| | | | | 136/251 |
| 2015/0365046 | A1* | 12/2015 | Lerner | H02S 20/00 |
| | | | | 136/251 |

FOREIGN PATENT DOCUMENTS

| | | | |
|---|---|---|---|
| WO | 2006040514 | A1 | 4/2006 |
| WO | 2015192126 | A1 | 12/2015 |

OTHER PUBLICATIONS

English machine translation of DE 10 2009 022641 (Year: 2009).*
International Search Report and Written Opinion for PCT/IB2017/000030, dated Apr. 3, 2017.

* cited by examiner

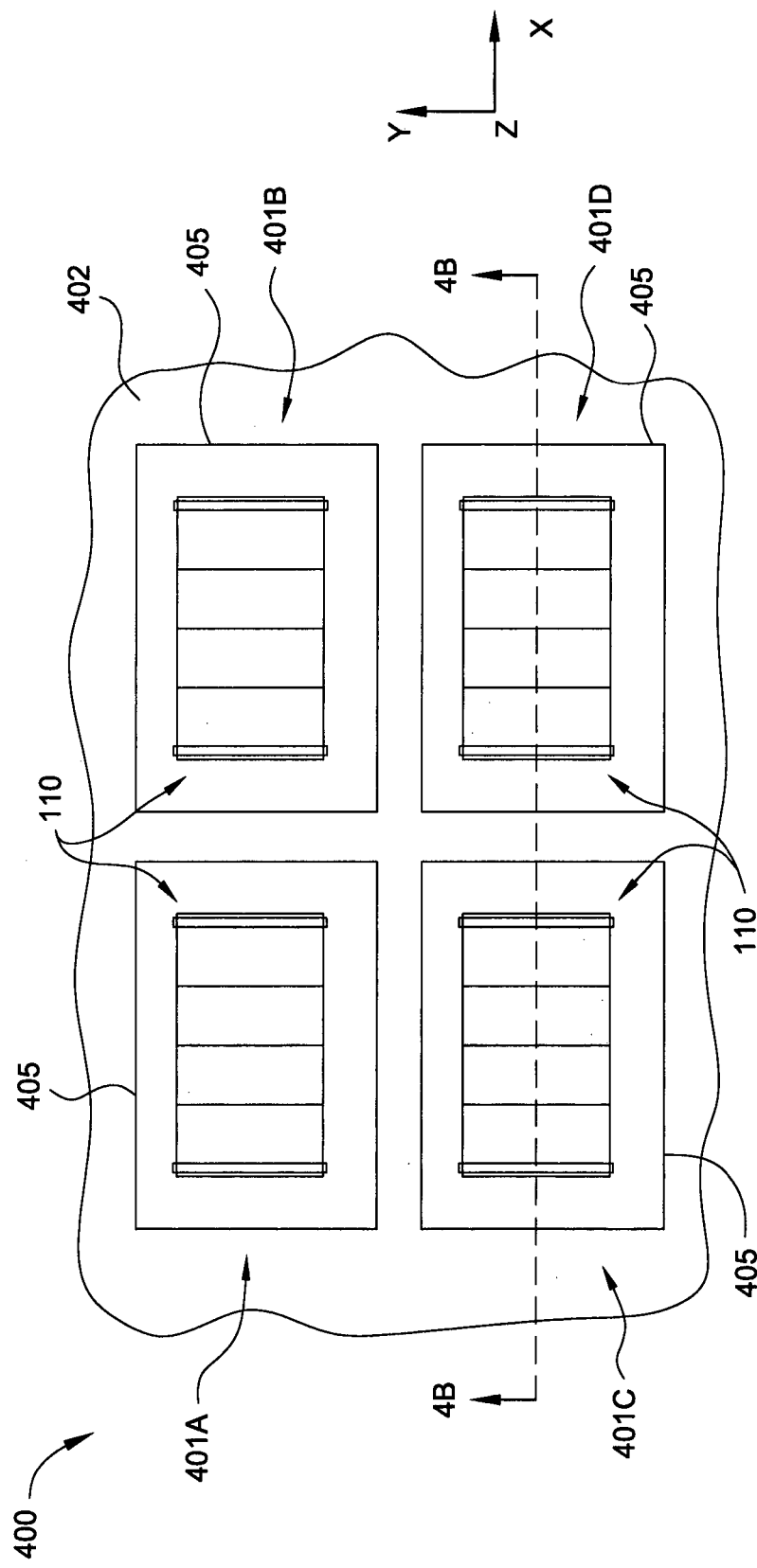
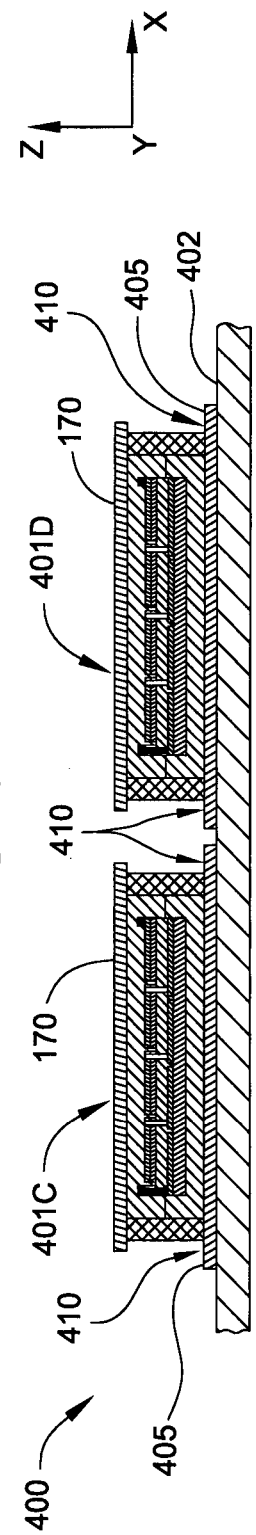
FIG. 4A
FIG. 4B

US 11,621,361 B2

ARRANGEMENTS OF FLEXIBLE PHOTOVOLTAIC MODULES

CROSS-REFERENCE TO PRIOR APPLICATIONS

This application is a continuation of International Application No. PCT/IB2017/000030, filed Jan. 23, 2017, which claims the benefit of U.S. Application No. 62/288,260, filed Jan. 28, 2016. The above applications are herein incorporated by reference herein.

BACKGROUND

Field

Embodiments of the present disclosure generally relate to assemblies that contain flexible photovoltaic modules.

Description of the Related Art

Photovoltaic apparatuses have conventionally employed a rigid layer of crystalline silicon as the active photovoltaic layer in the apparatus. These crystalline silicon photovoltaic apparatuses are generally formed on rigid substrates and the resulting apparatus can be quite rigid and heavy, which can result in high installation costs, especially for portable or temporary power generation applications. More recently, thin-film photovoltaic apparatuses using flexible photovoltaic layers, such as layers of Cu(In,Ga)Se$_2$ semiconductor, also known as CIGS, have been developed to compete with conventional photovoltaic apparatuses. These flexible thin-film photovoltaic apparatuses can also be significantly lighter than their crystalline silicon counterparts. Despite the advantages of using thin-film photovoltaic apparatuses, the costs of installation may still contribute to a user of energy choosing another source, such as fossil fuels. Thus, there is a continuing need to reduce the installation costs of thin-film photovoltaics to make these photovoltaics more cost competitive with other forms of energy, such as fossil fuels.

SUMMARY

Embodiments of the present disclosure generally relate to arrangements of flexible photovoltaic modules. In one embodiment, a photovoltaic apparatus is provided including a first photovoltaic module and a second photovoltaic module. Each photovoltaic module includes a front sheet having an outer portion and an inner portion. The outer portion is disposed around a core to form a keder. Each photovoltaic module further includes a back sheet and a photovoltaic device disposed between the front sheet and the back sheet. Each photovoltaic device includes an array of photovoltaic cells.

In another embodiment, a photovoltaic apparatus is provided including a plurality of photovoltaic modules. Each photovoltaic module includes a front sheet, a back sheet including a plurality of holes, and a photovoltaic device disposed between the front sheet and the back sheet. Each photovoltaic apparatus further includes a first belt disposed through a first set of two or more of the plurality of holes of the back sheet.

In another embodiment, a photovoltaic apparatus is provided including a plurality of photovoltaic modules. Each photovoltaic module includes a front sheet, a back sheet, and a photovoltaic device disposed between the front sheet and the back sheet. The photovoltaic apparatus further includes a textile, wherein the back sheet of each photovoltaic module is sewed to the textile.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 4A is a top sectional view of a photovoltaic apparatus, according to one embodiment.

FIG. 4B is a side cross sectional view of the photovoltaic apparatus of FIG. 4A, according to one embodiment.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to an arrangement of flexible photovoltaic modules that can be mounted on or connected to a surface, such as a roof, building façade, wall or shading structure. Embodiments of the present disclosure generally include an arrangement of flexible photovoltaic modules within an assembly and a method of forming the same.

Figure 1A:
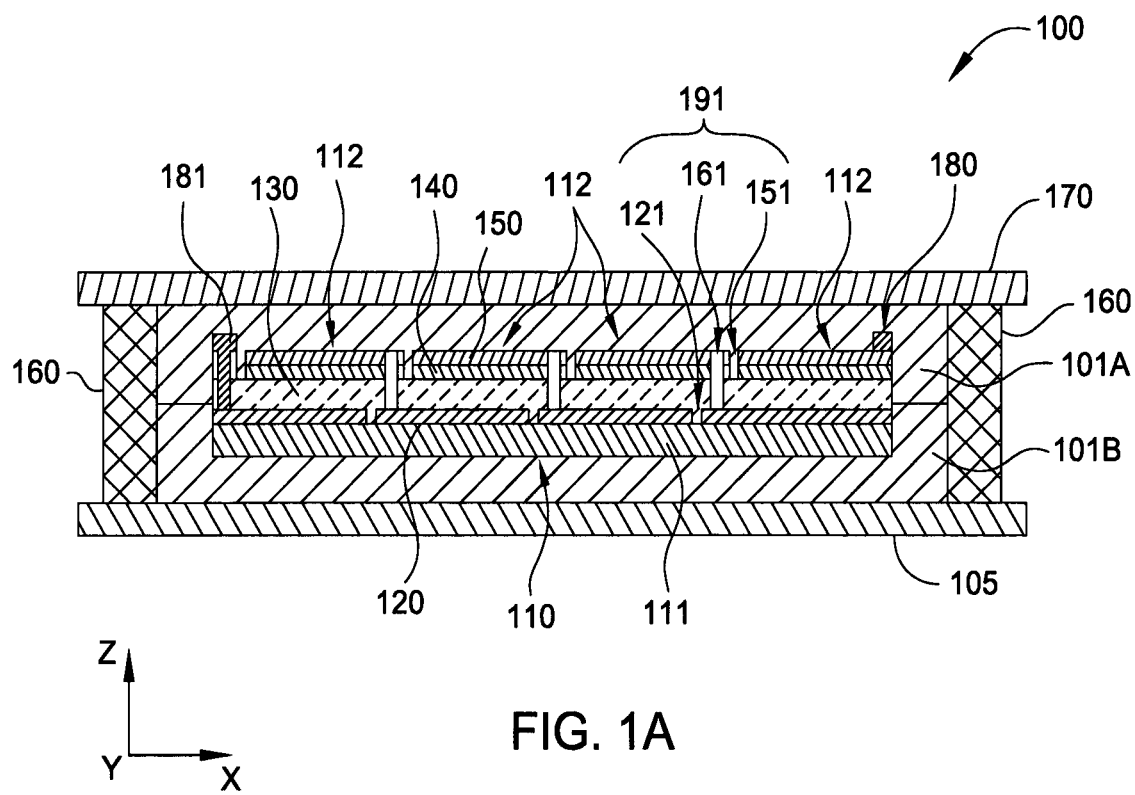
FIG. 1A is a side cross sectional view of a photovoltaic apparatus, according to one embodiment.
Figure 1B:
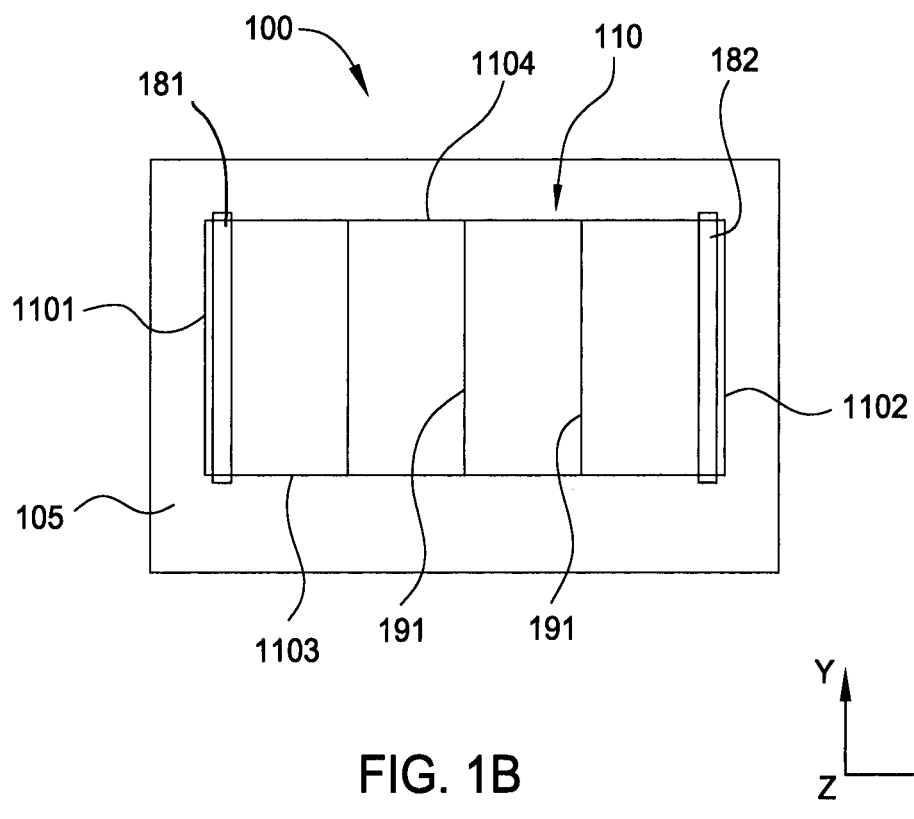
FIG. 1B is a top sectional view of the photovoltaic apparatus of FIG. 1A, according to one embodiment.

FIG. 1A is a side cross sectional view of a photovoltaic module 100, according to one embodiment. FIG. 1B is a top view of a portion of the photovoltaic module 100. The top view of the photovoltaic module 100 illustrated in FIG. 1B as well as the top views of the photovoltaic modules 301A-C of FIG. 3B and the photovoltaic modules 400A-D of FIG. 4A are shown without a front sheet 170, an edge seal 160, a front-side adhesive 101A, and a back-side adhesive 101B (all described below) to give a clearer view of the arrangement of layers and components in these photovoltaic modules. The photovoltaic module 100 may include multiple optoelectronic devices, such as photovoltaic devices (e.g., solar cells), diodes, and LEDs. The view in FIG. 1A and FIG. 1B of the photovoltaic module 100 are shown including one photovoltaic device 110, however, more photovoltaic devices 110 may be included in other embodiments.

Each photovoltaic device 110 is formed on a substrate 111. The substrate 111 may be a flexible substrate, a rigid substrate, or semi-rigid material containing substrate (i.e., semi-rigid substrates distort under their own weight, but are unable to be wound into a roll like a flexible substrate), and is typically formed from an electrically insulating material.

For example, in one embodiment a polyimide substrate may be used to form a flexible substrate 111.

In some embodiments, each photovoltaic device 110 may include a plurality of thin-film layers that are deposited on the substrate 111, and then patterned (e.g., scribed) to form a plurality of monolithically interconnected photovoltaic cells 112 that are electrically connected in series in an array. The array extends in the X-direction (first direction) from a first end 1101 of the photovoltaic device 110 to a second end 1102 of the photovoltaic device 110. Each photovoltaic cell 112 extends from a first side 1103 of the photovoltaic device 110 to a second side 1104 of the photovoltaic device 110. In some embodiments, the photovoltaic device 110 can include a photovoltaic device formed on another substrate that is then positioned on the substrate 111.

Each photovoltaic device 110 can be formed of, for example, a back-contact layer 120 formed on the substrate 111, an absorber layer 130 formed over the back-contact layer 120, and a front-contact layer 150 formed over the absorber layer 130. The back-contact layer 120 can be fabricated from a material having a high optical reflectance and is commonly made of molybdenum (Mo) although several other thin-film materials, such as metal chalcogenides, molybdenum chalcogenides, molybdenum selenides (such as MoSe2), sodium (Na)-doped Mo, potassium (K)-doped Mo, Na- and K-doped Mo, transition metal chalcogenides, tin-doped indium oxide (ITO), doped or non-doped indium oxides, doped or non-doped zinc oxides, zirconium nitrides, tin oxides, titanium nitrides, titanium (Ti), tungsten (W), tantalum (Ta), gold (Au), silver (Ag), copper (Cu), and niobium (Nb) may also be used or included advantageously. In some embodiments, the back-contact layer is deposited onto the substrate 111 by use of sputtering process.

The absorber layer 130 is typically made of an "ABC" material, wherein "A" represents elements in group 11 of the periodic table of chemical elements as defined by the International Union of Pure and Applied Chemistry including copper (Cu) or silver (Ag), "B" represents elements in group 13 of the periodic table including indium (In), gallium (Ga), or aluminum (Al), and "C" represents elements in group 16 of the periodic table including sulfur (S), selenium (Se) or tellurium (Te). An example of an ABC material is the Cu(In,Ga)Se2 semiconductor also known as CIGS. In some embodiments, the absorber layer 130 may be a polycrystalline material. In other embodiments, the absorber layer 130 may be a monocrystalline material. Another example of a material that may be used as the absorber layer 130 is chalcopyrite.

The front-contact layer 150 can be an electrically conductive and optically transparent material, such as a transparent conductive oxide (TCO) layer. For example, in some embodiments, the front-contact layer 150 may be formed of doped or non-doped variations of materials: such as indium oxides, tin oxides, or zinc oxides.

In some embodiments, a semiconductive buffer layer 140 can be disposed between the absorber layer 130 and the front-contact layer 150. The semiconductive buffer layer 140 ordinarily has an energy band gap higher than 1.5 eV. The semiconductive buffer layer 140 may be formed of materials, such as CdS, Cd(S,OH), CdZnS, indium sulfides, zinc sulfides, gallium selenides, indium selenides, compounds of (indium, gallium)-sulfur, compounds of (indium, gallium)-selenium, tin oxides, zinc oxides, Zn(Mg,O)S, Zn(O,S) material, or variations thereof.

A first busbar 181 forms an electrical connection to the photovoltaic device 110, such as to the back-contact layer 120 through a connection region of the front-contact layer 150 of the photovoltaic device 110 that is coupled to the back-contact layer 120. The first busbar 181 may be a conductive material that forms the cathode of the photovoltaic device 110. In some embodiments, the first busbar 181 may be formed of a flexible material. The busbars described herein may also be referred to as conductors.

A second busbar 182 forms an electrical connection to the photovoltaic device 110, such as to the front-contact layer 150 of the photovoltaic device 110. The second busbar 182 may be a conductive material that forms the anode of the photovoltaic device 110. In some embodiments, the second busbar 182 may be formed of a flexible material.

A serial interconnect 191 forms an electrical connection between each adjacent photovoltaic cell 112. Each serial interconnect 191 includes a connecting groove 161 (i.e., P2 scribe line) that is formed through the front-contact layer 150, the semiconductive buffer layer 140 and the absorber layer 130 to form an electrically conductive path that electrically connects adjacent photovoltaic cells 112. The conductive path may be formed by melting a portion of the absorber layer 130 during a laser scribing process used to form the connecting groove 161. For example, one connecting groove 161 electrically connects the front-contact layer 150 of the third photovoltaic cell 112 shown in FIG. 1A to the back-contact layer 120 of the fourth photovoltaic cell 112 shown in FIG. 1A.

Each serial interconnect 191 includes a pair of grooves to electrically isolate portions of each adjacent photovoltaic cell 112. A back-contact groove 121 (i.e., P1 scribe line) electrically isolates back-contact layers 120 of adjacent photovoltaic cells from each other. A front-contact groove 151 (i.e., P3 scribe line) electrically isolates front-contact layers 150 of adjacent photovoltaic cells from each other. The serial interconnects 191 collectively electrically connect the photovoltaic cells 112 in the photovoltaic device 110 in series.

Each photovoltaic device 110 may be encapsulated by use of a front-side adhesive 101A and a back-side adhesive 101B. The front-side adhesive 101A can be formed over the front-contact layer 150 of the photovoltaic device 110. The front-side adhesive 101A may be formed of a flexible material, such as a flexible polymer. For example, in one embodiment the front-side adhesive 101A may be formed of a thermoplastic olefin (TPO) based polymer or a TPO blend.

The back-side adhesive 101B is disposed over the side of the substrate 111 that is opposite to the side that the photovoltaic device 110 is formed. The back-side adhesive 101B may be formed of a flexible material, such as a flexible polymer. For example, in one embodiment the back-side adhesive 101B may be formed of a thermoplastic olefin-based polymer (TPO) or a TPO polymer blend. The back-side adhesive 101B, which may contact the front-side adhesive 101A, can completely surround and encapsulate the photovoltaic module 100 to protect the photovoltaic device 110 from the external environment.

A front sheet 170 can be disposed on an outer surface of the front-side adhesive 101A, such as a top surface of the front-side adhesive 101A. The front sheet 170 can be formed of a transparent material, such as glass or a transparent thermoplastic polymer. The front sheet 170 may be formed of a flexible material.

A back sheet 105 can be disposed on an outer surface of the back-side adhesive 101B, such as a bottom surface of the back-side adhesive 101B. The back sheet 105 may include a reflective material, such as a metal layer, a reflective polymer or a polymer with a reflective layer (e.g., metal foil). In some embodiments, the back sheet 105 may be formed of a rigid material. In other embodiments, the back sheet 105 may be formed of a flexible material. In some embodiments, a fiber-reinforced polymer may be used as the material for the back sheet 105. In still other embodiments, the back sheet 105 may be formed of glass material, or even of fabric material.

The photovoltaic device 110 can further include an optional edge seal 160 disposed around the edges of each photovoltaic device 110. The edge seal 160 can extend from an inner surface (e.g., top surface in FIG. 1A) of the back sheet 105 to an inner surface of the front sheet 170 (e.g., bottom surface in FIG. 1A). The presence of the edge seal 160 at the edge of the photovoltaic module 100 can help assure that photovoltaic module 100 can eliminate common photovoltaic apparatus manufacturing and photovoltaic device failure modes by preventing moisture and other substances from diffusing into the photovoltaic device 110. In some embodiments, the edge seal 160 can be formed over an outer surface of the front sheet 170 and/or back sheet 105 to provide an even better seal against the external environment. In general, the edge seal 160 comprises a polymeric material, such as an elastomer, for example a butyl rubber or silicone material.

The photovoltaic module 100 may further include a junction box (not shown) and an opening (not shown) extending through the back sheet 105. The junction box and the opening through the back sheet 105 may be used to route one or more conductors to electrically connect the photovoltaic module 100 to one or more external devices, such as electronics used to charge one or more external batteries.

Figure 2:
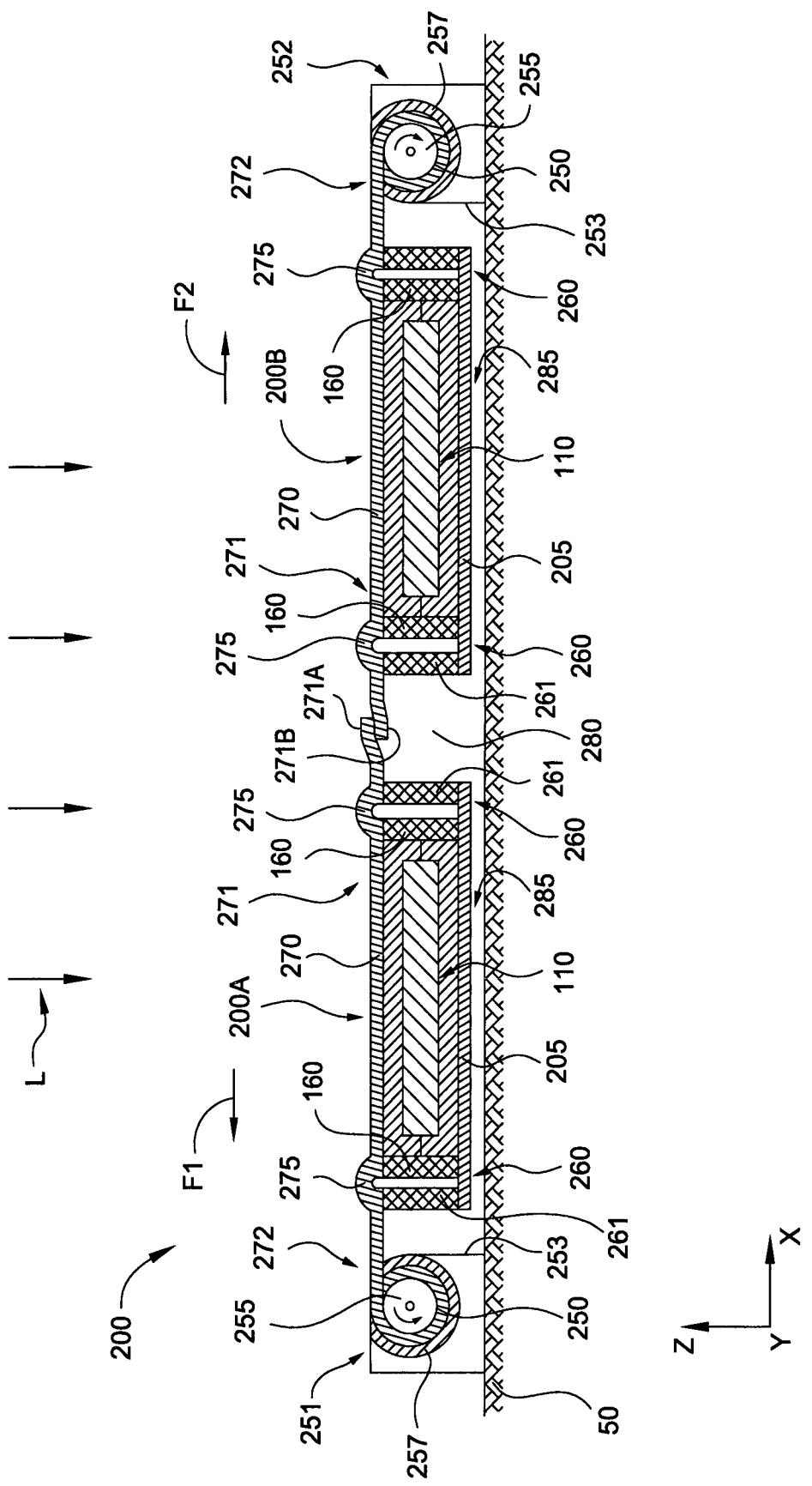
FIG. 2 is a side cross sectional view of a photovoltaic apparatus, according to one embodiment.

FIG. 2 is a side cross sectional view of a photovoltaic apparatus 200, according to one embodiment. The photovoltaic apparatus 200 is one embodiment of an arrangement of photovoltaic modules that can be installed on a wall, roof, or other supporting structure, so that power can be generated by the photovoltaic apparatus 200 from sunlight L. The photovoltaic apparatus 200 includes a first photovoltaic module 200A secured to a first mount 251 and a second photovoltaic module 200B secured to a second mount 252. Each mount 251, 252 is attached (e.g., fastened) to a structure 50 (e.g., a roof or wall). The photovoltaic modules 200A, 200B include all of the same components as the photovoltaic module 100 described above as well as some additional components. Furthermore, some of the components from the photovoltaic module 100 described above have been modified to form the photovoltaic modules 200A, 200B. For example, the photovoltaic modules 200A, 200B include a front sheet 270 and a back sheet 205 with different features from the front sheet 170 and the back sheet 105 described above, as will be explained below.

Each front sheet 270 includes an inner portion 271 and an outer portion 272. The inner portion 271 of the front sheet 270 of first photovoltaic module 200A is attached to the inner portion 271 of the front sheet 270 of second photovoltaic module 200B. In some embodiments, the inner portion 271 of the front sheet 270 of the first photovoltaic module 200A includes an overlap 271A, and the inner portion 271 of the front sheet 270 of the second photovoltaic module 200B includes an overlap 271B. As illustrated in FIG. 2, the overlap 271A may extend over the overlap 271B. The overlap 271A can be attached to the overlap 271B, for example, by use of an adhesive or ultrasonic welding.

However, in some embodiments, a single front sheet 270 can extend from the first mount 251 to the second mount 252, so that a continuous surface can extend over and support both photovoltaic modules 200A, 200B without the overlaps 271A, 271B between the photovoltaic modules 200A, 200B.

Furthermore, in some embodiments an additional barrier layer (not shown) can be disposed between the front sheet 270 and the photovoltaic device 110, such as a transparent barrier layer disposed on the front-side adhesive 101A. In some embodiments, the transparent barrier layer may include a barrier foil or material layer that is able to act as a barrier to prevent the intrusion of various environmental contaminants. In one example, the transparent barrier layer includes a transparent conductive oxide (TCO) layer or polymeric material (e.g., ETFE) that is at least partially transparent to light.

In some embodiments, when one of the photovoltaic modules 200A or 200B becomes inoperable, the damaged photovoltaic module 200A, 200B can be removed from the photovoltaic apparatus 200. In one example, the damaged photovoltaic module 200A can be removed by sectioning or cutting through the various layers and/or components positioned between the photovoltaic modules 200A and 200B. In some configurations the sectioning process may be easily performed by use of a blade, scissors, shears, a cut-off saw or other similar cutting device. In some configurations, the cut formed during the sectioning process is made outside of the edge seals of the photovoltaic modules 200A, and 200B. The module edge seal is separately disposed around the edges of each photovoltaic module 200A, 200B. A new photovoltaic module 200A" (not shown) can then be joined with the remaining photovoltaic module 200B by bonding an overlap 271A formed on the front sheet 270 of the new module 200A" with an overlap 271B formed on the front sheet 270 of the remaining photovoltaic module 200B. The opposite end of the front sheet 270 of the new photovoltaic module 200A" can then also be coupled to the first mount 251 to reconstruct the photovoltaic apparatus 200 illustrated in FIG. 2.

The outer portion 272 of each front sheet 270 is disposed around a core 255 to form a keder 250. The core 255 can be a rigid material, such as a metal or plastic bar. The keder 250 is generally used to secure or mount the photovoltaic module 200A, 200B to another structure. For example, each mount 251 includes a receiving element 257 and each keder 250 can be positioned on or over the receiving element 257 of one of the mounts 251. The receiving element 257 can be a groove, tube or other mounting profile specifically designed to receive the respective keder 250. Using the keders 250, which are built into the photovoltaic apparatus 200, can increase the speed at which the photovoltaic apparatus 200 is installed on a supporting structure, as the keders 250 can reduce the process of mounting the photovoltaic apparatus 200 to simply inserting the keders 250 on or over one or more corresponding receiving elements once the mounts 251, 252 are in place.

Each receiving element 257 can also be rotatable to adjust the tension applied to the front sheets 270 in the X-direction. The tension on the front sheets 270 can support the photovoltaic modules 200A, 200B over the structure 50. Proper tension on the front sheets 270 can help prevent damage to the photovoltaic modules 200A, 200B caused by applied external loads (e.g., high wind). For example, the receiving elements 257 are spaced apart from each other in the X-direction, and the receiving elements 257 can be rotatable about the Y-axis to apply or adjust the tension in one or both of the front sheets 270 in the X-direction. The receiving element 257 coupled to the keder 250 of the first photovoltaic module 200A can be rotated counter clockwise and the receiving element 257 coupled to the keder 250 of the second photovoltaic module 200B can be rotated clockwise to apply a tensile force F1 and F2 to the front sheets 270 of the first and second photovoltaic modules 200A and 200B.

Although proper tension on the front sheets 270 can help reduce damage to the photovoltaic modules 200A, 200B caused by high mechanical stresses created by an externally applied load (e.g. wind loads), damage can nevertheless still occur to the photovoltaic modules. To further reduce damage caused by an applied load, each front sheet 270 may further include one or more optional non-planar features, such as humps 275. In one example, the optional humps 275 extend outward (e.g., above or below in the Z-direction) from the other portions of the front sheet 270. The non-planar features, or humps 275, can be configured to take up at least some of an externally applied load, which is applied to one or both of the photovoltaic modules 200A, 200B during normal operation, and/or reduce some of the stress applied to the edge seal 160 and adhesive layers 101A and 101B in the photovoltaic modules 200A and 200B when the tensile forces F1 and F2 are applied to the front sheets 270. For example, in some embodiments the humps 275 can be formed of a material having a higher elasticity or different cross-sectional dimensions than the remainder of the front sheet. In some configurations, the front sheet 210 may have a non-planar feature that extends in a direction that is aligned relative to an edge of the front sheet. For example, the cross-section of the non-planar feature shown in FIG. 2 extends in a direction that is aligned with the Y-direction and also parallel to the overlap 271A regions.

The tension on the front sheets 270 can also be used to keep the photovoltaic modules 200A, 200B displaced a desired distance from the structure 50. A gap 285 formed between the structure 50 and the back sheets 205 of the photovoltaic modules 200A, 200B can be maintained when the photovoltaic modules 200A, 200B are mounted to the structure 50 using the mounts 251, 252. This displacement can help ensure that the photovoltaic modules 200A, 200B and the structure do not damage each other during installation or use. In some embodiments, the back sheets 205 may receive additional support, for example, by a wire or cable attached to the structure 50.

In some embodiments, the back sheets 205 of the photovoltaic modules 200A, 200B include an outer portion 260. This outer portion 260 can be used to add an outer seal 261 that extend between the back sheet 205 and front sheet 270 and proximate to the location of the humps 275. Because the humps 275 are the locations on the front sheet 270 most likely to stretch or compress when a load is applied, the addition of the outer seal 261, which is disposed on an opposing side of a hump 275 from the photovoltaic device 110, can provide an extra layer of protection from the external environment for the photovoltaic modules 200A, 200B at these locations. In this configuration, flexural rigidity of the material in the outer seal 261 in the X and/or Y-directions and compressive and tensile strength in the +Z and/or —Z-directions can be used to take-up at least some of the loads applied to the photovoltaic modules 200A, 200B. In general, the outer seal 261 includes a polymeric material, such as an elastomer, for example a butyl rubber or silicone material. In some embodiments, when the front sheet 270 is stretched in the X-direction, portions of the hump 275 can extend past the outer seal 261.

In some embodiments, the interior region 280 of the photovoltaic apparatus 200 can optionally be filled with a compressed gas. A seal can be created between the outer portions of the photovoltaic apparatus 200, such as the mounts 251, and the structure 50. The photovoltaic apparatus 200 may include additional mounts (not shown) extending in the X-direction, so that a seal may be created between these mounts and the structure 50. The compressed gas that is delivered from a gas source (not shown) can be used to increase the pressure in the interior region 280 to ensure the front sheets 270 do not sag in the Z-direction. In some embodiments the compressed gas can be delivered to the interior region 280 to bow the front sheets outward to increase the surface area of the photovoltaic modules 200A, 200B exposed to the sunlight L.

Figure 3A:
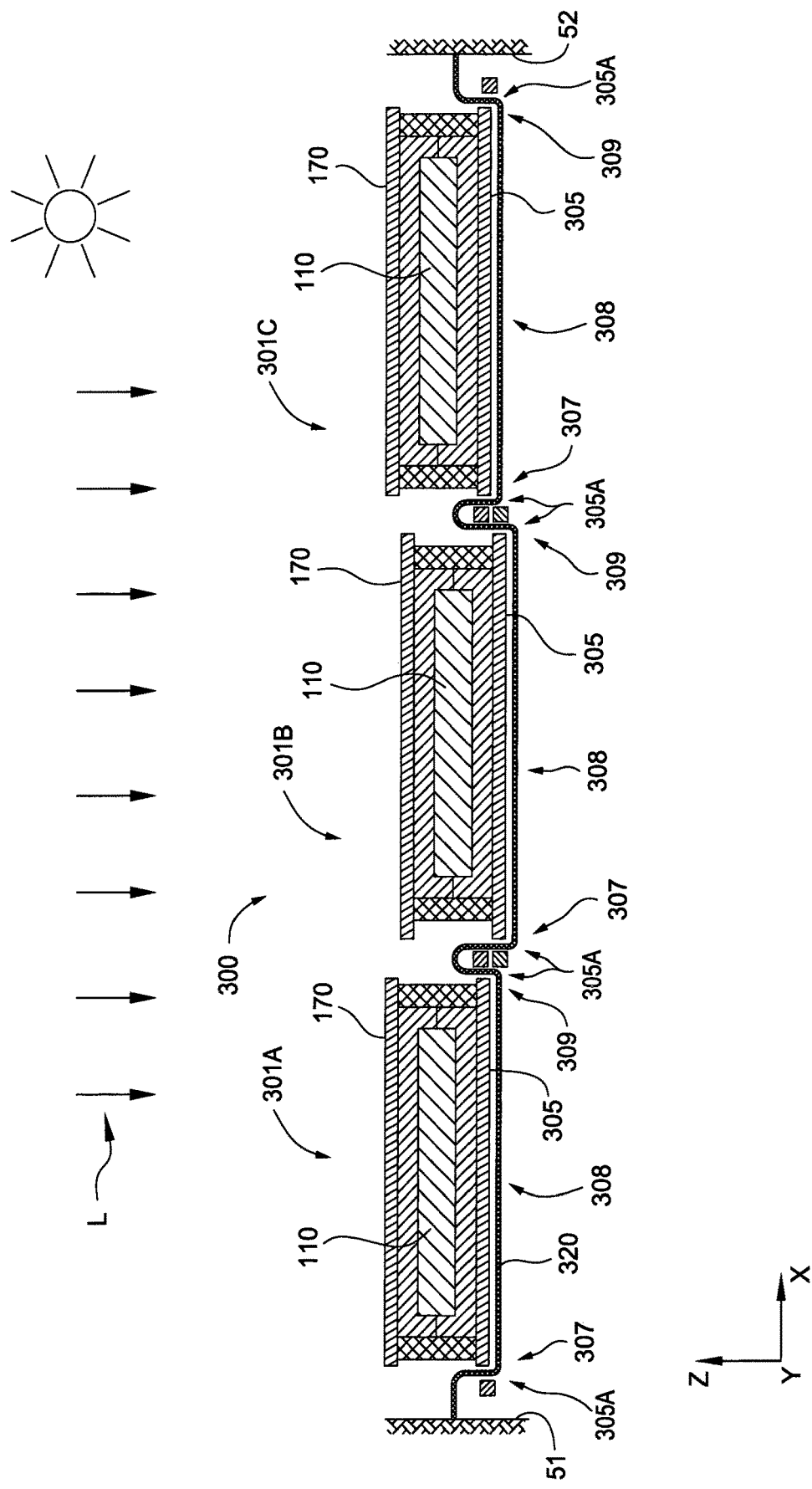
FIG. 3A is a side cross sectional view of a photovoltaic apparatus, according to one embodiment.
Figure 3B:
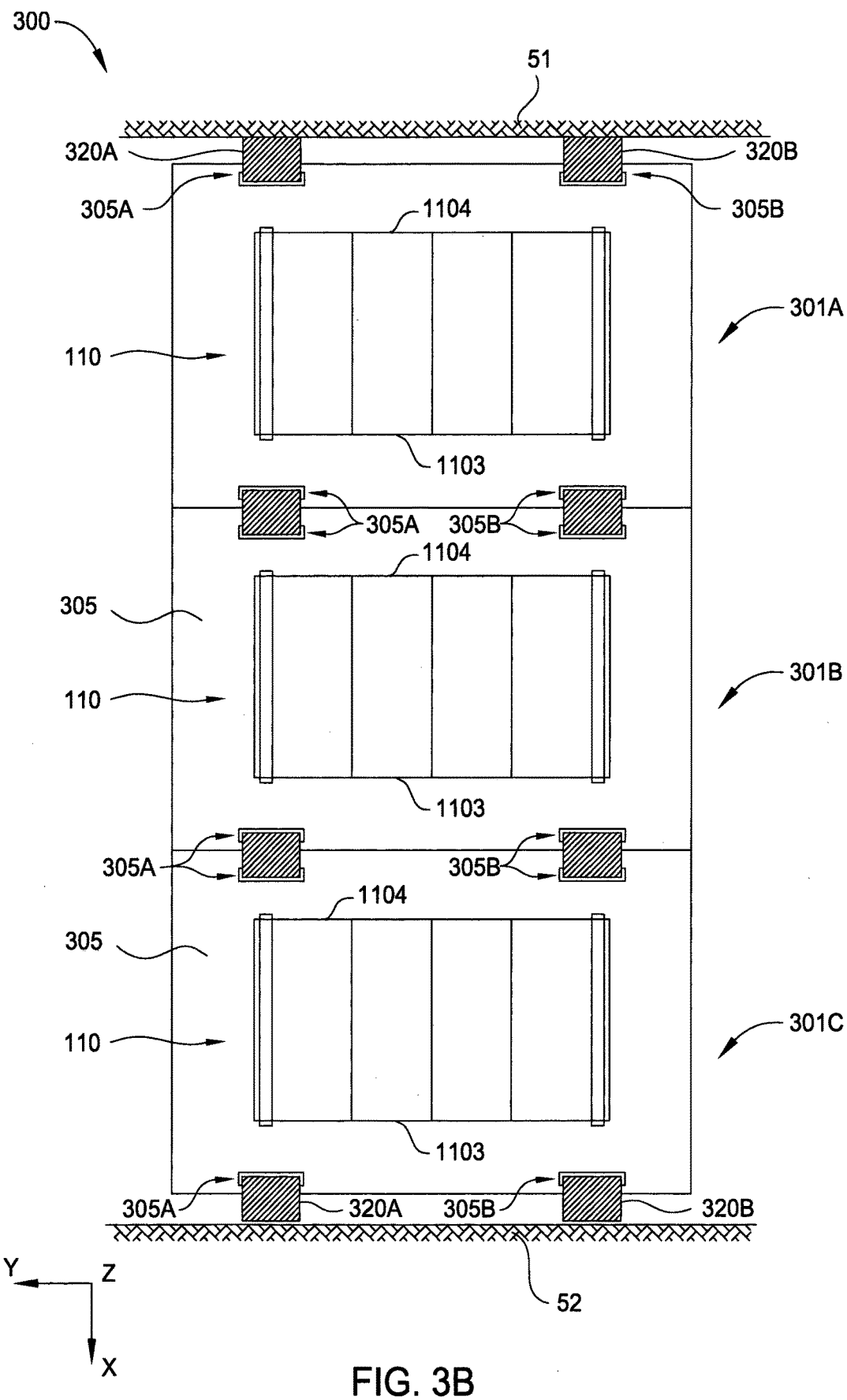
FIG. 3B is a top sectional view of the photovoltaic apparatus of FIG. 3A, according to one embodiment.

FIG. 3A is a side cross sectional view of a photovoltaic apparatus 300, according to one embodiment. FIG. 3B is a top sectional view of the photovoltaic apparatus 300. The photovoltaic apparatus 300 is one embodiment of an arrangement of photovoltaic modules that can be quickly installed between a pair of supporting structures 51, 52 (e.g., a pair of walls or a ceiling and floor), so that power can be generated by the photovoltaic apparatus 300 from sunlight L. The photovoltaic apparatus 300 includes a first photovoltaic module 301A, a second photovoltaic module 301B, and a third photovoltaic module 301C. The photovoltaic modules 301A, 301B, 301C (collectively referred to as photovoltaic modules 301) are the same as the photovoltaic module 100 described above except that the photovoltaic modules 301 each include a modified back sheet 305. Some embodiments may include more or less photovoltaic modules 301 than the three shown in FIGS. 3A and 3B.

The photovoltaic apparatus 300 includes at least one belt 320 (FIG. 3A), such as a first belt 320A and a second belt 320B as shown in FIG. 3B. The belts 320A, 320B can be used to support the photovoltaic modules 301 between the structures 51, 52. Each belt 320A, 320B can be secured to the opposing structures 51, 52 using a clip, ratchet, vise, or other mechanism that can attach (e.g., fasten) a belt 320A, 320B to the structures 51, 52. Some embodiments may include mechanical spacers on the belts 320 so that the position of the photovoltaic modules 301 on the belts 320 can be adjusted.

Each photovoltaic module 301 includes a plurality of holes formed in the front sheet 170 or the back sheet 305. In one embodiment, the plurality of holes are formed in the back sheet 305, and the plurality of holes include a first pair of holes 305A (FIGS. 3A and 3B) a second pair of holes 305B (FIG. 3B). The first belt 320A can be routed through the first pair of holes 305A of each photovoltaic module 301. The second belt 320B can be routed through the second pair of holes 305B of each photovoltaic module 301. The holes 305A, 305B are arranged proximate the outer corners of the photovoltaic apparatus 300. For each photovoltaic module 301, a hole 305A from the first pair and a hole 305B from the second pair are located between the first side 1103 of the photovoltaic device 110 and a corresponding first side of the photovoltaic module (i.e., the side of the photovoltaic module 301 closest to the first side 1103 of the photovoltaic device 110). Similarly, for each photovoltaic module 301, a hole 305A from the first pair and a hole 305B from the second pair are located between the second side 1104 of the photovoltaic device 110 and a corresponding second side of the photovoltaic module 301 (i.e., the side of the photovoltaic module 301 closest to the second side 1104 of the photovoltaic device 110).

The belts 320A, 320B can be positioned through the respective holes 305A, 305B extending over and under portions of the back sheet 305 of each photovoltaic module 301. For each photovoltaic module 301, as illustrated in FIG. 3A, the belts 320A, 320B can extend over a first outer portion 307 of the back sheet 305, extend under an inner portion 308 of the back sheet 305, and then extend over a second outer portion 309 of the back sheet 305. Routing the belts 320A, 320B only over the outer portions 307, 309 of the photovoltaic modules 301 prevents the belts 320A, 320B from being positioned between the photovoltaic device 110 and the sun. In some embodiments, as shown in FIG. 3A, the back sheets 305 of adjacent photovoltaic modules 301 can overlap to increase the density of photovoltaic cells 112 in a given area or to create a more shaded area beneath or behind the photovoltaic modules 301. Despite this overlap, in some embodiments the photovoltaic modules 301 can be arranged on the belts 320 so that the front sheet 170 of each of the photovoltaic modules 301 is substantially parallel (e.g., within 5 degrees) to the front sheets 170 of the other photovoltaic modules 301 in the photovoltaic apparatus 300. Using the belts 320A, 320B allows the photovoltaic apparatus 300 to be rapidly and easily installed. For example, installation can be completed by positioning the belts 320A, 320B through the corresponding holes 305A, 305B of the back sheet 305 for each of the photovoltaic modules 301 as described above, and then tension can be applied to the belts 320A, 320B by securing the belts 320A, 320B to clips or other holding mechanisms, which are mounted to the supporting structures 51, 52. In one example, installation can be completed by weaving the belts 320A, 320B through the corresponding holes 305A, 305B of each of the photovoltaic modules 301, and then applying tension to the belts 320A, 320B by securing the belts 320A, 320B to one or more tension applying mechanisms (e.g., a first mount 251 and/or second mount 252), which are mounted to the supporting structures 51, 52.

FIG. 4A is a top sectional view of a photovoltaic apparatus 400, according to one embodiment. FIG. 4B is a side cross sectional view of the photovoltaic apparatus of FIG. 4B, according to one embodiment. The photovoltaic apparatus 400 is another embodiment of an arrangement of photovoltaic modules that can be quickly installed. The photovoltaic apparatus 400 includes a first photovoltaic module 401A, a second photovoltaic module 401B, a third photovoltaic module 401C, and a fourth photovoltaic module 401D. The photovoltaic modules 401A, 401B, 401C, 401D (collectively referred to as photovoltaic modules 401) are the same as the photovoltaic module 100 described above except that the photovoltaic modules 401 each include a modified back sheet 405. The back sheet 405 extends further away from the photovoltaic device 110 than the back sheet 105 described above. Around the outer edges of the back sheet 405, the back sheet can be sewed or otherwise secured to a flexible textile 410, such as a tissue. The flexible textile 410 can be formed of a light-weight material that enables the photovoltaic apparatus 400 to be used for applications that may be inappropriate or undesirable for heavier photovoltaic apparatuses. For example, in one embodiment the photovoltaic apparatus 400 can form part of a balloon that could be quickly deployed into the air to begin producing power.

While the foregoing is directed to embodiments of the present disclosure, other and further embodiments of the disclosure may be devised without departing from the basic scope thereof, and the scope thereof is determined by the claims that follow.

What is claimed is:
1. A photovoltaic apparatus comprising:
  a first photovoltaic module and a second photovoltaic module, each photovoltaic module comprising:
    a front sheet having an outer portion and an inner portion, wherein the outer portion is disposed over a core;
    a back sheet;
    a photovoltaic device disposed between the front sheet and the back sheet, wherein each photovoltaic device comprises an array of photovoltaic cells; and
    one or more outwardly extending non-planar features formed in the front sheet that are configured to stretch or compress when a load is applied to the front sheet, wherein
      the one or more outwardly extending non-planar features extend in a first direction, and
      the one or more outwardly extending non-planar features are disposed a distance from the core, along a surface of the front sheet, in a second direction that is perpendicular to the first direction.
2. The photovoltaic apparatus of claim 1, wherein each of the one or more outwardly extending non-planar features are proximate to an edge seal that is disposed between the front sheet and the back sheet.
3. The photovoltaic apparatus of claim 2, wherein
  the outer portion of the front sheet of the first photovoltaic module that is disposed over a core forms a first keder;
  the outer portion of the front sheet of the second photovoltaic module that is disposed over a core forms a second keder; and
  the photovoltaic apparatus further comprises:
    a first receiving element and a second receiving element, wherein the first keder of the first photovoltaic module is disposed over the first receiving element and the second keder of the second photovoltaic module is disposed over the second receiving element.
4. The photovoltaic apparatus of claim 3, wherein
  the first receiving element and the second receiving element are rotatable about an axis that extends in a third direction that is substantially perpendicular to the first direction.
5. The photovoltaic apparatus of claim 2, wherein each of the one or more outwardly extending non-planar features are proximate to an outer seal that is disposed between the front sheet and the back sheet.
6. The photovoltaic apparatus of claim 1, wherein the inner portion of the front sheet of the first photovoltaic module is attached to the inner portion of the front sheet of the second photovoltaic module.
7. The photovoltaic apparatus of claim 1, further comprising an edge seal and wherein the one or more outwardly extending non-planar features are disposed above the edge seal, wherein the edge seal extends in the first direction from an inner surface of a back sheet to an inner surface of the front sheet.
8. The photovoltaic apparatus of claim 1, wherein the one or more outwardly extending non-planar features have an elasticity that is different from the elasticity of a portion of the front sheet in which the one or more outwardly extending non-planar features are not formed.
9. The photovoltaic apparatus of claim 1, wherein
  the first photovoltaic module and the second photovoltaic module each have a first side and a second side,
  the first side and the second side are disposed a distance apart in the first direction, and
  the one or more outwardly extending non-planar features are disposed on the first side of the first photovoltaic module and the first side of the second photovoltaic module.

10. The photovoltaic apparatus of claim 1, wherein the one or more outwardly extending non-planar features comprises a first outwardly extending non-planar feature and a second outwardly extending non-planar feature.

11. The photovoltaic apparatus of claim 10, wherein the first outwardly extending non-planar feature is proximate to a first edge seal, and the second outwardly extending non-planar feature is proximate to a second edge seal.

12. The photovoltaic apparatus of claim 11, wherein the first outwardly extending non-planar feature is proximate to a first outer seal, and the second outwardly extending non-planar feature is proximate to a second outer seal.

13. The photovoltaic apparatus of claim 10, wherein the photovoltaic device is disposed between the first outwardly extending non-planar feature and the second outwardly extending non-planar feature.

* * * * *